(12) United States Patent
Wang et al.

(10) Patent No.: US 12,326,659 B2
(45) Date of Patent: Jun. 10, 2025

(54) RETICLE CONTAINER HAVING MAGNETIC LATCHING

(71) Applicant: ENTEGRIS, INC., Billerica, MA (US)

(72) Inventors: Huaping Wang, Eden Prairie, MN (US); Russ V. Raschke, Chanhassen, MN (US); Caleb Elwell, Manitou Springs, CO (US); Matthew Reber, Chaska, MN (US); Brian Wiseman, Glencoe, MN (US)

(73) Assignee: ENTEGRIS, INC., Billerica, MA (US)

( * ) Notice: Subject to any disclaimer, the term of this patent is extended or adjusted under 35 U.S.C. 154(b) by 41 days.

(21) Appl. No.: 18/132,227

(22) Filed: Apr. 7, 2023

(65) Prior Publication Data

US 2023/0333463 A1 Oct. 19, 2023

Related U.S. Application Data

(60) Provisional application No. 63/332,681, filed on Apr. 19, 2022.

(51) Int. Cl.
  *G03F 1/66* (2012.01)
  *B65D 25/10* (2006.01)
(52) U.S. Cl.
  CPC .............. *G03F 1/66* (2013.01); *B65D 25/10* (2013.01)
(58) Field of Classification Search
  CPC ........ B65D 85/48; B65D 25/10; B65D 41/36; B65D 51/00; B65D 85/38; G03F 1/66; H01L 21/677

USPC ................ 206/454–455, 710–711, 724, 832; 211/41.18
See application file for complete search history.

(56) References Cited

U.S. PATENT DOCUMENTS

| | | | | |
|---|---|---|---|---|
| 4,045,291 A * | 8/1977 | Berger | ..................... | B01L 3/502 435/297.5 |
| 6,831,541 B1 * | 12/2004 | Seidler | .................. | H01F 7/0263 206/818 |
| 8,317,048 B2 * | 11/2012 | Hajichristou | ...... | B65D 43/0225 220/230 |
| 8,348,061 B2 * | 1/2013 | Komatsuda | ............ | A45D 40/18 220/230 |
| 8,403,143 B2 * | 3/2013 | Chiu | ................. | H01L 21/67353 206/724 |
| 8,424,703 B2 * | 4/2013 | Meulen | ............. | H01L 21/67373 70/253 |
| 9,958,772 B1 * | 5/2018 | Hsueh | .................... | B65D 85/38 |
| 11,119,420 B2 * | 9/2021 | Lee | .................. | H01L 21/67069 |

* cited by examiner

*Primary Examiner* — Bryon P Gehman

(57) ABSTRACT

Reticle containers include a magnetic latch to close the container and clamp the reticle contained within. The magnetic latch includes at least one magnet and another ferromagnetic material, which can be either another magnet or a magnetically attractable material. At least one of the magnets and the other ferromagnetic material can be manipulated to secure or open the container. The manipulation can include at least one of sliding of a housing, rotation of a magnet, or application of an external magnetic field to change the attraction of the magnet and the other ferromagnetic material.

16 Claims, 6 Drawing Sheets

RETICLE CONTAINER HAVING MAGNETIC LATCHING

FIELD

This disclosure is directed to a container for storage and/or transportation of a reticle, particularly one including a magnetic latch for closure of the container.

BACKGROUND

Reticles typically are transported, processed, and stored in reticle containers which include an inner pod and an outer pod. The inner pod is configured such that it can be used during the processing of the reticles, for example in photolithography such as extreme ultraviolet (EUV) processes. The features of inner pods making them suitable for use in reticle processing such as filters, formation of seals, and/or other features of the inner pods can make the inner pods more complex and expensive, and less suitable for storage of reticles.

SUMMARY

This disclosure is directed to a container for storage and/or transportation of a reticle, particularly one including a magnetic latch for closure of the container.

A magnetic latch can allow a container for a reticle such as a reticle container, a pod or other container used in a reticle stocker, or the like to be secured and to clamp the reticle within the container. Magnetic latches can allow closure of the container while providing relatively reduced particle generation and/or causing any particle generation to occur well away from the interior of the container and thus unlikely to contaminate the reticle. Magnetic latching further can allow for closure and clamping across a range of different thicknesses for reticles that may be contained within the reticle container.

In an embodiment, a reticle container includes a first container segment including a ferromagnetic material and a second container segment including one or more magnets. The reticle container is configured to be switched between a latched state where the one or more magnets attracts the ferromagnetic material of the first container segment and an unlatched state the attraction between the ferromagnetic material and the one or more magnets is reduced such that the first container segment can be separated from the second container segment. The first container segment and the second container segment define an internal space configured to accommodate a reticle.

In an embodiment, the ferromagnetic material of the first container segment includes one or more magnets. In an embodiment, when in the unlatched state, the one or more magnets of the second container segment repel the ferromagnetic material of the first container segment.

In an embodiment, the one or more magnets of the second container segment include at least one rotatable magnet.

In an embodiment, the second container segment includes a slidable body, the slidable body including the one or more magnets. In an embodiment, the slidable body includes a plurality of magnets. In an embodiment, the slidable body includes a polymer material.

In an embodiment, the ferromagnetic material of the first container segment is provided on a slidable body included in the first container segment. In an embodiment, the slidable body includes a polymer material.

In an embodiment, the ferromagnetic material of the first container segment is configured to be energized to provide an electromagnet.

In an embodiment, the one or more magnets are configured to be energized to switch the container to the unlatched state.

In an embodiment, a method of securing and opening a reticle container includes magnetically latching a first container segment to a second container segment by attraction between a ferromagnetic material included in the first container segment and one or more magnets included in the second container segment and unlatching the first container segment from the second container segment by reducing the attraction between the ferromagnetic material and the one or more magnets such that the first container segment can be separated from the second container segment.

In an embodiment, switching the magnetic latch includes moving one or more magnets and the ferromagnetic material apart from one another. In an embodiment, moving the one or more magnets and the ferromagnetic material apart from one another includes sliding a body including one of the one or more magnets or the ferromagnetic material.

In an embodiment, the ferromagnetic material included in the first container segment includes one or more magnets. In an embodiment, unlatching the first container segment from the second container segment includes positioning the one or more magnets of the ferromagnetic material included in the first container segment so as to oppose the one or more magnets of the second container segment having the same polarity. In an embodiment, positioning the one or more magnets of the ferromagnetic material included in the first container segment so as to oppose one or more magnets of the second container segment having the same polarity includes sliding a body containing the one or more magnets of the ferromagnetic material included in the first container segment or the one or more magnets of the second container segment. In an embodiment, positioning the one or more magnets of the ferromagnetic material included in the first container segment so as to oppose the one or more magnets of the second container segment having the same polarity includes rotating at least one of the one or more magnets of the ferromagnetic material included in the first container segment or the one or more magnets of the second container segment.

In an embodiment, unlatching the first container segment from the second container segment includes energizing an electromagnet such that the one or more magnets and the ferromagnetic material repel one another.

DRAWINGS

DETAILED DESCRIPTION

This disclosure is directed to a container for storage and/or transportation of a reticle, particularly one including a magnetic latch for closure of the container.

As defined herein, "ferromagnetic material" includes materials that are capable of being attracted or repelled by magnets, including materials that are magnetized to form a magnet and materials that otherwise respond to magnetic fields. Non-limiting examples of ferromagnetic materials include iron, nickel, cobalt, alloys thereof, rare earth materials, minerals such as lodestone and the like, and natural and synthetic permanent magnets such as neodymium and the like. In some embodiments, the ferromagnetic material has not been magnetized to itself provide a magnetic field, but can be attracted by a magnetic field provided by a separate magnet. In some embodiments, the ferromagnetic material has been magnetized and is itself a magnet providing a magnetic field that can interact with a magnetic field of another magnet so as to be attracted to or repelled by the other magnet.

Figure 1:
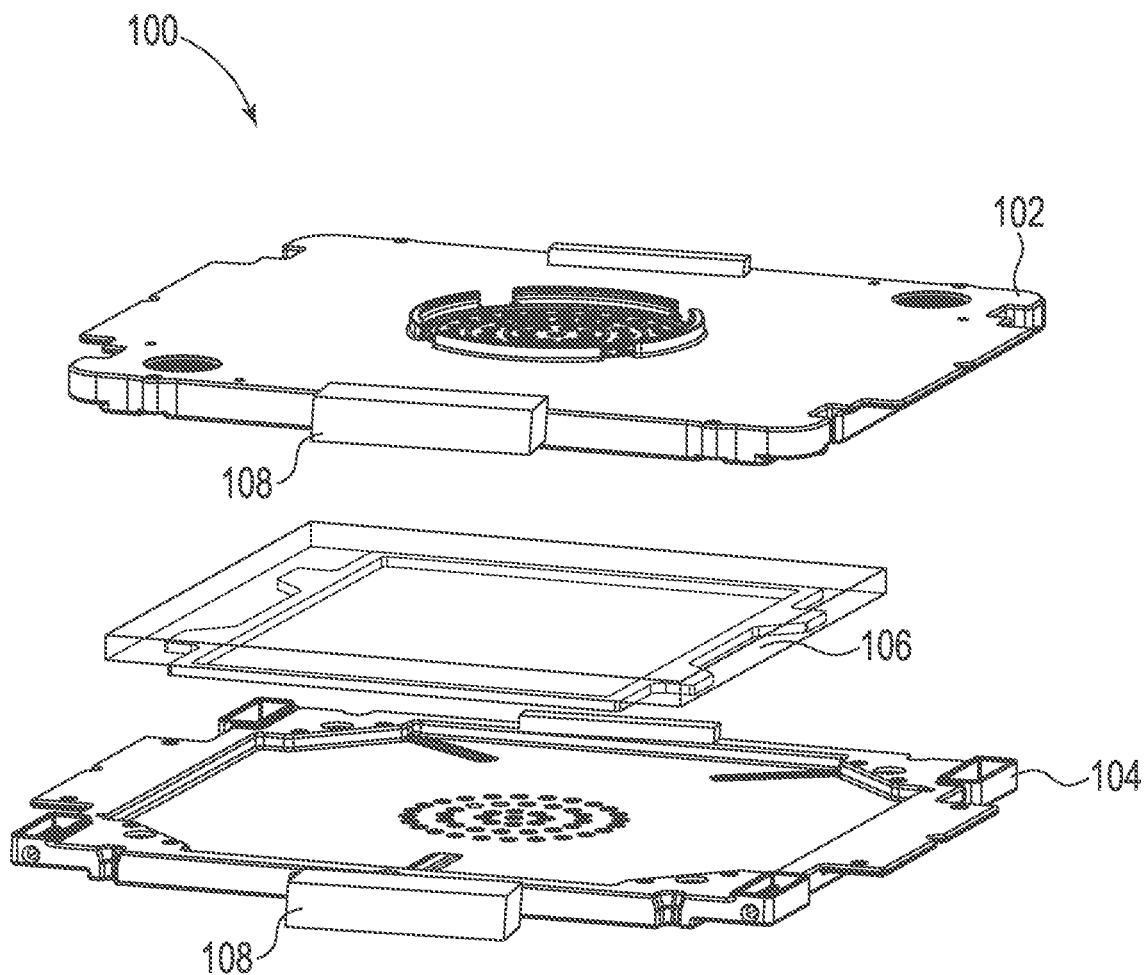
FIG. 1 shows an exploded view of a reticle container and reticle according to an embodiment.

FIG. 1 shows an exploded view of a reticle container and reticle according to an embodiment. Reticle container 100 includes cover 102 and baseplate 104. The reticle container is configured to accommodate reticle 106. Cover 102 includes one or more cover magnetic latching features 108. Baseplate 104 includes one or more baseplate magnetic latching features 110.

Reticle container 100 is a container configured to accommodate a reticle 106, such as a reticle for processing such as photolithography, for example extreme ultraviolet (EUV) processing. The reticle container 100 can be used to transport and/or store the reticle. In an embodiment, the reticle container 100 is an EUV reticle container. In an embodiment, the reticle container 100 is a stocker pod for storage of reticle 106 prior to, during, or after processing. In an embodiment, the reticle container 100 can be received at a load port of an EUV processing device to be opened and for the reticle 106 to be added to or removed from the reticle container 100. The reticle container 100 contains the reticle 106 in an internal space within the reticle container 100. In an embodiment, the reticle container 100 clamps reticle 106 to secure the reticle 106 in a particular position. In an embodiment, the reticle container 100 forms a seal around its perimeter when reticle 106 is contained within reticle container 100. In an embodiment, the reticle container 100 does not form a seal and includes a gap in at least some areas of the perimeter when reticle 106 is contained within reticle container 100.

Cover 102 forms a first container segment of the reticle container 100. The cover 102 forms part of an internal space configured to accommodate the reticle 106. The cover 102 includes cover magnetic latching features 108. The cover magnetic latching features 108 are configured to interact with the baseplate magnetic latching features 110 by way of magnetic fields such that cover 102 and baseplate 104 can be secured to one another in a latched state, and can be separated from one another in a release state. In an embodiment, the cover magnetic latching features 108 include one or more magnets. In an embodiment, the cover magnetic latching features 108 include one or more ferromagnetic materials. In an embodiment, the cover magnetic latching features 108 are configured to be connected to a power source such that an electromagnet can be energized in the cover magnetic latching features 108. In an embodiment, the cover magnetic latching features 108 include a slidable body containing one or more magnets or ferromagnetic material. In an embodiment, the cover magnetic latching features 108 include a rotatable body containing one or more magnets or ferromagnetic material.

Baseplate 104 forms a second container segment of the reticle container 100. The baseplate 104, when combined with cover 102 forms the internal space capable of accommodating reticle 106. The baseplate 104 includes baseplate magnetic latching features 110. The cover magnetic latching features 108 are configured to interact with the baseplate cover latching features 108 by way of magnetic fields such that cover 102 and baseplate 104 can be secured to one another in a latched state, and can be separated from one another in a release state. In an embodiment, the baseplate magnetic latching features 110 include one or more magnets. In an embodiment, the baseplate magnetic latching features 110 include one or more ferromagnetic materials. In an embodiment, the baseplate magnetic latching features 110 are configured to be connected to a power source such that an electromagnet can be energized in the baseplate magnetic latching features 110. In an embodiment, the baseplate magnetic latching features 110 include a slidable body containing one or more magnets or ferromagnetic material. In an embodiment, the baseplate magnetic latching features 110 include a rotatable body containing one or more magnets or ferromagnetic material.

When the cover magnetic latching features 108 and the baseplate magnetic latching features 110 are in the unlatched state, the attraction between cover magnetic latching features 108 and baseplate magnetic latching features 110 is at or below a level at which the cover 102 and baseplate 104 can be readily separated. In an embodiment, the cover magnetic latching features 108 and the baseplate magnetic latching features 110 repel one another when in the unlatched state. In an embodiment, the attraction between the cover magnetic latching features 108 and the baseplate magnetic latching features 110 is reduced by changing positions of the cover magnetic latching features 108 and/or the baseplate magnetic latching features 110, for example by rotating or sliding bodies containing magnets or ferromagnetic materials included therein or energizing an electromagnet. When the cover magnetic latching features 108 and the baseplate magnetic latching features 110 are in the latched state, attraction between the cover magnetic latching features 108 and the baseplate magnetic latching features 110 can be sufficient to retain cover 102 and baseplate 104 together during handling and storage of reticle container 100, for example during movement of the reticle container 100, for example by workers or automation during processing and storage of the reticle 106. In an embodiment, the attraction in the latched state can be sufficient to resist shocks such as typical distances for dropping of the pod, accidental striking of the cover 102 or baseplate 104, or the like. In an embodiment, the attraction in the latched state includes attraction between respective opposite poles of magnets included in each of cover magnetic latching features 108 and baseplate magnetic latching features 110. In an embodiment, the attraction in the latched state includes attraction between one or more magnets provided in one of the cover magnetic latching features 108 or baseplate magnetic latching features 110 and ferromagnetic material that is not itself magnetized in the other of the cover magnetic latching features 108 or baseplate magnetic latching features 110. When in the latched state, the reticle 106 can be clamped between the cover 102 and the baseplate 104 by the force of attraction between cover magnetic latching features 108 and baseplate magnetic latching features 110. When in the latched state, the attraction can be sufficient to overcome the weight of the cover 102 and/or baseplate 104. For example, the attraction in the latched state can be 200 grams force (gf) or greater. In an embodiment, the attraction can be 500 gf or greater. In an embodiment, the attraction in the latched state can be between two and four pounds force (lbf). When in the latched state, the attraction can limit or prevent translational movement of the cover 102 and/or baseplate 104 relative to one another. When in an unlatched state, the attraction can be reduced such that the cover 102 and the baseplate 104 can be separated by, for example, automation performing the stocking of reticles 106 in reticle containers 100. In an embodiment, in the unlatched state, the cover 102 and the baseplate 104 repel one another. In an embodiment, in the unlatched state, an attraction between cover 102 and baseplate 104 is sufficiently reduced to allow separation of the cover 102 from the baseplate 104 by gravity, for example having the attraction be less than a weight of the cover 102 or the baseplate 104. The cover 102 and baseplate 104 can be separated by lifting one of cover 102 or baseplate 104, or by dropping a support below one of cover 102 and baseplate 104 while the other of cover 102 and baseplate 104 is supported. In an embodiment, the attraction of cover 102 and baseplate 104 can be reduced such that actuators such as automation in a load port are capable of separating cover 102 and baseplate 104.

Figure 2:
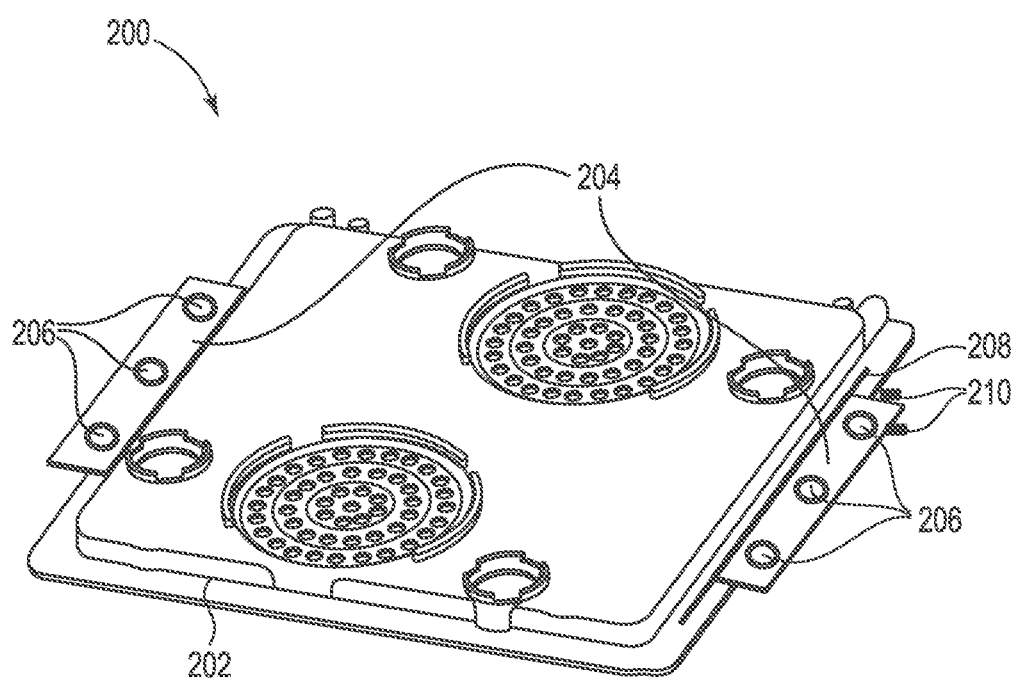
FIG. 2 shows a cover of a reticle container according to an embodiment.

FIG. 2 shows a cover of a reticle container according to an embodiment. Cover 200 includes cover body 202, cover magnetic material retainer 204, and cover magnetic materials 206. Movement channel 208 can optionally be included in cover body 202. Electrical contacts 210 can optionally be included in cover body 202 or cover magnetic material retainer 204.

Cover 200 is part of a reticle container, for example reticle container 100 as discussed above and shown in FIG. 1. Cover body 202 forms the portion of cover 200 configured to form a portion of an enclosed space for containing a reticle such as reticle 106. Cover body 202 can be configured to be joined to a baseplate, such as baseplate 300 as discussed below and shown in FIG. 3.

Cover magnetic material retainer 204 is configured to contain the cover magnetic materials 206. The cover magnetic material retainer 204 can be any suitable material for containing the cover magnetic material 206. In an embodiment, the cover magnetic material retainer 204 includes a polymer material, such as a polycarbonate. In an embodiment, the cover magnetic material retainer 204 includes a metal material such as aluminum. In an embodiment, the cover magnetic material retainer 204 is formed integrally with cover body 202 and is made of the same material. In an embodiment. Cover magnetic material retainer 204 can include one or more compartments to contain the cover magnetic material 206. In an embodiment, the cover magnetic material can be encased within the cover magnetic material retainer 204. In an embodiment, the cover magnetic material retainer 204 can hold the cover magnetic material 206 such that the cover magnetic material 206 can be rotated, for example by allowing a projection or recess provided in the cover magnetic material 206 to be exposed. In an embodiment, the cover magnetic material retainer 204 includes one or more rotatable compartments configured to accommodate the cover magnetic material 206. In embodiments, rotatable compartments of the cover magnetic material retainer 204 can include a projection or recess configured to be interfaced with by users or automation such that the compartments can be rotated.

Cover magnetic material 206 can be a ferromagnetic material as defined above. In an embodiment, the cover magnetic material 206 includes a magnet, such as a permanent magnet. In an embodiment, the cover magnetic material includes a material that is responsive to magnetic fields but is not itself magnetized. In an embodiment, the cover magnetic material 206 is configured such that it can be energized to provide an electromagnet. When cover magnetic material 206 includes a magnet, the baseplate can include a ferromagnetic material as defined above, either another magnet, or a material that is not magnetized but is responsive to the magnetic fields provided by the cover magnetic material. When cover magnetic material 206 includes a ferromagnetic material that is not itself magnetized, the magnetic material included in a baseplate includes a magnet. The cover magnetic material 206 can be provided as one or more pieces of the ferromagnetic material included in the cover magnetic material retainer 204.

In an embodiment, the cover magnetic material retainer 204 can be slidable to move the cover magnetic material 206 such that the reticle container can be switched from the latched state to the unlatched state. In an example of such an embodiment, the cover magnetic material retainer 204 can be configured to ride in a movement channel 208 that can be formed in cover body 202. In this embodiment, sliding of the cover magnetic material retainer 204 along the movement channel 208 can bring the cover magnetic material 206 into or out of alignment with magnetic material included in the baseplate to increase or reduce the attraction and put the reticle container into the latched or unlatched state based on the position of the cover magnetic material 206 relative to the magnetic material included in the baseplate.

In an embodiment, the cover magnetic material 206 can be configured to be energized to provide an electromagnet to latch or unlatch the container. For example, the cover magnetic material 206 can be magnetic material ordinarily attracted to one or more magnets provided on the baseplate to latch the cover 200 to the baseplate. When the reticle container is to be unlatched, the cover magnetic material 206 can be energized to form an electromagnet that repels the one or more magnets provided on the baseplate to unlatch the cover 200 from the baseplate. The cover magnetic material 206 can be energized to form such an electromagnet by current provided by an external source, such as automation at a load port or stocking device that handles the reticle container, or a hand-held tool used by an operator. The current can be provided from the external source to the cover magnetic material 206 by contact at electrical contacts 210 that can be provided on cover body 202 or cover magnetic material retainer 204 in such embodiments.

In an embodiment, the cover magnetic material 206 can include a magnet configured to be rotated such that attraction to magnetic material included in the baseplate can be altered to switch the reticle container 200 between the latched and unlatched states. Examples of such rotatable magnets and their operation are provided in FIGS. 5 and 6 and discussed below. When rotatable magnets are used as the cover magnetic material 206, the cover magnetic material retainers 204 can be any suitable containers for allowing suitable rotation of the magnets as discussed below.

Figure 3:
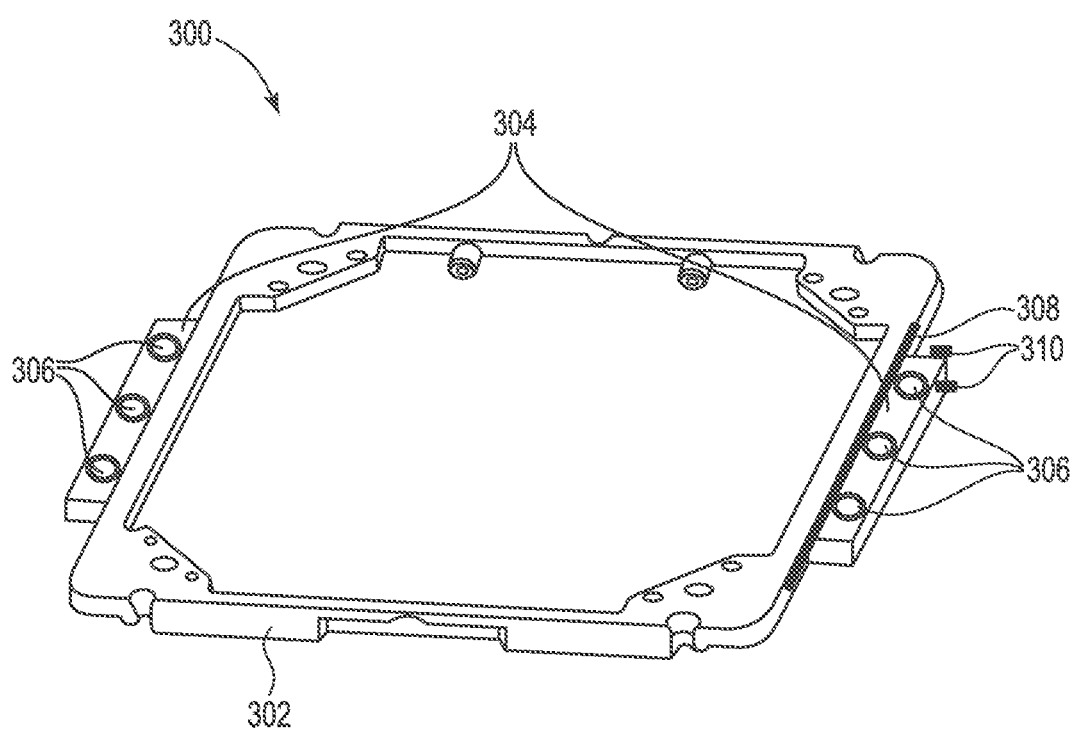
FIG. 3 shows a baseplate of a reticle container according to an embodiment.

FIG. 3 shows a baseplate of a reticle container according to an embodiment. Baseplate 300 includes baseplate body 302, baseplate magnetic material retainers 304, and magnetic materials 306. Movement channel 308 can optionally be included in baseplate body 302. Electrical contacts 310 can optionally be included in baseplate body 302 or baseplate magnetic material retainer 304.

Baseplate 300 can be a segment of a reticle container such as reticle container 100 as discussed above and shown in FIG. 1. The baseplate 300 can combine with a cover such as cover 200 described above and shown in FIG. 2 to form the reticle container. Baseplate body 302 forms the primary portion of the baseplate 300. The baseplate body 302 can in part define an area in which a reticle, such as reticle 106 as described above and shown in FIG. 1, can be contained when the baseplate 300 is combined with a cover.

Baseplate magnetic material retainer 304 is configured to contain the baseplate magnetic materials 306. The baseplate magnetic material retainer 304 can be any suitable material for containing the baseplate magnetic material 306. In an embodiment, the baseplate magnetic material 304 includes a polymer material, such as a polycarbonate. In an embodiment, the baseplate magnetic material retainer 304 includes a metal material such as aluminum. In an embodiment, the baseplate magnetic material retainer 304 is formed integrally with baseplate body 302 and is made of the same material. In an embodiment. Baseplate magnetic material retainer 304 can include one or more compartments to contain the baseplate magnetic material 306. In an embodiment, the baseplate magnetic material can be encased within the baseplate magnetic material retainer 304. In an embodiment, the baseplate magnetic material retainer 304 can hold the baseplate magnetic material 306 such that the baseplate magnetic material 306 can be rotated, for example by allowing a projection or recess provided in the baseplate magnetic material 306 to be exposed. In an embodiment, the baseplate magnetic material retainer 304 includes one or more rotatable compartments configured to accommodate the baseplate magnetic material 306. In embodiments, rotatable compartments of the baseplate magnetic material retainer 304 can include a projection or recess configured to be interfaced with by users or automation such that the compartments can be rotated.

Baseplate magnetic material 306 can be a ferromagnetic material as defined above. In an embodiment, the baseplate magnetic material 306 includes a magnet, such as a permanent magnet. In an embodiment, the baseplate magnetic material includes a material that is responsive to magnetic fields but is not itself magnetized. In an embodiment, the baseplate magnetic material 306 is configured such that it can be energized to provide an electromagnet. When baseplate magnetic material 306 includes a magnet, the cover such as cover 200 can include a ferromagnetic material as defined above, either another magnet, or a material that is not magnetized but is responsive to the magnetic fields provided by the baseplate magnetic material. When baseplate magnetic material 306 includes a ferromagnetic material that is not itself magnetized, the magnetic material included in the cover such as cover 200 includes a magnet. The baseplate magnetic material 306 can be provided as one or more pieces of the ferromagnetic material included in the baseplate magnetic material retainer 304.

In an embodiment, the baseplate magnetic material retainer 304 can be slidable to move the baseplate magnetic material 306 such that the reticle container can be switched from the latched state to the unlatched state. In an example of such an embodiment, the baseplate magnetic material retainer 304 can be configured to ride in a movement channel 308 that can be formed in baseplate body 302. In this embodiment, sliding of the baseplate magnetic material retainer 304 along the movement channel 308 can bring the baseplate magnetic material 306 into or out of alignment with magnetic material included in the cover to increase or reduce the attraction and put the reticle container into the latched or unlatched state based on the position of the baseplate magnetic material 306 relative to the magnetic material included in the cover.

In an embodiment, the baseplate magnetic material 306 can be configured to be energized to provide an electromagnet to latch or unlatch the container. For example, the baseplate magnetic material 306 can be magnetic material ordinarily attracted to one or more magnets provided on the cover such as cover 200 to latch the baseplate 300 to the baseplate. When the reticle container is to be unlatched, the baseplate magnetic material 306 can be energized to form an electromagnet that repels the one or more magnets provided on the baseplate to unlatch the baseplate 300 from the baseplate. The baseplate magnetic material 306 can be energized to form such an electromagnet by current provided by an external source, such as automation at a load port or stocking device that handles the reticle container, or a hand-held tool used by an operator. The current can be provided from the external source to the baseplate magnetic material 306 by contact at electrical contacts 310 that can be provided on baseplate body 302 or baseplate magnetic material retainer 304 in such embodiments.

In an embodiment, the baseplate magnetic material 306 can include a magnet configured to be rotated such that attraction to magnetic material included in the baseplate can be altered to switch the reticle container 300 between the latched and unlatched states. Examples of such rotatable magnets and their operation are provided in FIGS. 5 and 6 and discussed below. When rotatable magnets are used as the baseplate magnetic material 306, the baseplate magnetic material retainers 304 can be any suitable containers for allowing suitable rotation of the magnets as discussed below.

Figure 4:
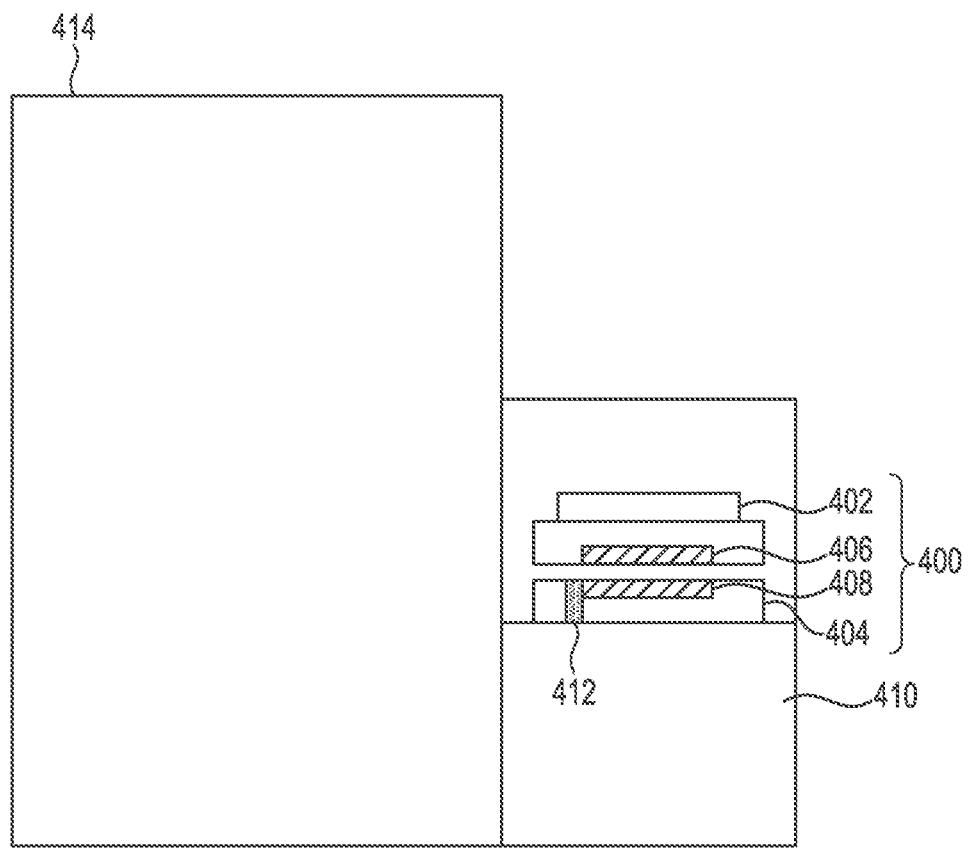
FIG. 4 shows a reticle container in a load port according to an embodiment.

FIG. 4 shows a reticle container in a load port according to an embodiment. Reticle container 400 includes cover 402 and baseplate 404. Cover 402 includes one or more cover magnetic latching features 406. Baseplate 404 includes one or more baseplate magnetic latching features 408. Load port 410 is configured to receive the reticle container 400. Load port 410 includes an actuator 412 configured to manipulate at least one of the cover magnetic latching features 406 or the baseplate magnetic latching features 408 to affect the closure of reticle container 400.

Reticle container 400 can be any suitable reticle container as described herein. Reticle container 400 is configured to contain a reticle handled by load port 410 of a tool 414 used to process reticle, for example through photolithography such as extreme ultraviolet (EUV) photolithography. The reticle container 400 can be a stocker pod configured to store the reticle, for example by being placed into a stocker device (not shown). The reticle container 400 includes cover 402 and baseplate 404, which combine to form an internal space configured to accommodate the reticle. The reticle container 400 is configured to be secured by attraction between cover magnetic latching features 406 provided on cover 402 and baseplate magnetic latching features provided on baseplate 404.

The load port 410 is part of tool 414 configured to receive reticle container 400 and to remove a reticle from or place a reticle into the reticle container 400. The load port 410 includes actuator 412. Actuator 412 can be any suitable actuator for interfacing with the cover magnetic latching features 406 and/or the baseplate magnetic latching features 408 such that reticle container 400 can be switched from the latched state to the unlatched state or from the unlatched state to the latched state. In an embodiment, the actuator is configured to push a slidable body included in the cover magnetic latching features 406 and/or the baseplate magnetic latching features 408 so as to change an alignment of magnets and ferromagnetic material such that cover 402 and baseplate 404 have increased or reduced attraction to one another. In an embodiment, the actuator 412 is configured to rotate magnets or magnet assemblies such as rotatable magnet 500 or rotatable magnet assembly 600 as described below and shown in FIGS. 5 and 6, respectively. The actuator 412 can be configured to engage with interface features provided on the rotatable magnet or rotatable magnet assembly so as to drive rotation to change the alignment of magnets or the strength of emitted fields such that cover 402 and baseplate 404 have increased or reduced attraction to one another. In an embodiment, actuator 412 is configured to contact cover magnetic latching features 406 and/or the baseplate magnetic latching features 408 at electrical contacts such as electrical contacts 210 or 310 as described above and shown in FIGS. 2 and 3, respectively, such that the actuator 412 can energize the cover magnetic latching features 406 and/or the baseplate magnetic latching features 408. The energization can provide an electromagnet at the cover magnetic latching features 406 and/or the baseplate magnetic latching features 408 that is configured such that cover 402 and baseplate 404 have the attraction therebetween reduced or repel one another, such that cover 402 and baseplate 404 can be unlatched and separated.

Figure 5:
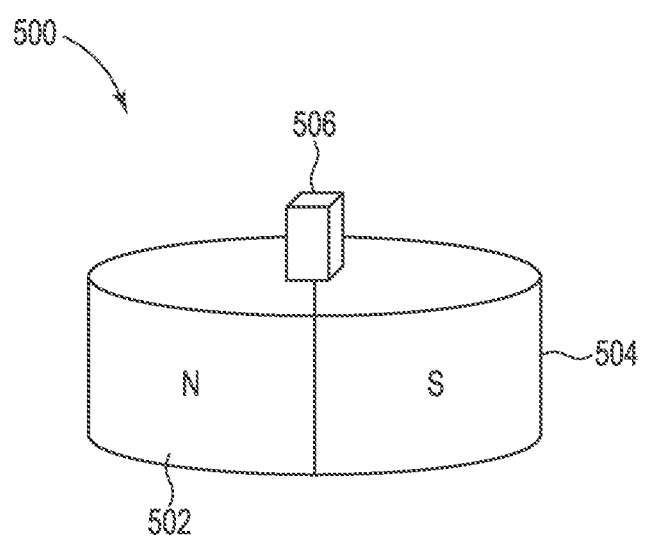
FIG. 5 shows a rotatable magnet according to an embodiment.

FIG. 5 shows a rotatable magnet according to an embodiment. Rotatable magnet 500 has a cylindrical shape including a north pole side 502 and a south pole side 504. The rotatable magnet 500 can further include and interface feature 506. The rotatable magnet 500 is configured to be rotated such that the positions of the north pole side 502 and the south pole side 504 can be reversed in position relative to other magnets by the rotation. In an embodiment, the rotatable magnet 500 can be rotated by a user or automation engaging with the interface feature 506. The interface feature 506 can be a depression or a projection having a cross-sectional area such that the rotatable magnet 500 can be readily rotated by engagement by a tool or user. For example, the cross-sectional area of the interface feature can be a slot, a star, a cross, an oval, or any other suitable shape allowing rotation of the rotatable magnet by engagement with the interface feature 506. In an embodiment, the rotatable magnet 500 can be housed in a housing that is rotated to reverse the positions of the north pole side 502 and the south pole side 504. The rotatable magnet 500 can be used to switch between latched and unlatched positions by changing the position of the north pole side 502 and the south pole side 504 relative to the north and south poles of another magnet provided on an opposing portion of the reticle container. In the latched state, the rotatable magnet 500 can be positioned such that the north pole side 502 is positioned towards a south pole of the magnet on the opposing portion of the reticle container and the south pole side 504 is positioned towards a north pole of the magnet on the opposing portion of the reticle container, such that the portions of the reticle container are attracted to one another. In the unlatched state, the rotatable magnet 500 can be positioned such that the north pole side 502 is positioned towards a north pole of the magnet on the opposing portion of the reticle container and the south pole side 504 is positioned towards a south pole of the magnet on the opposing portion of the reticle container, such that the portions of the reticle container repel one another.

In an embodiment, rotatable magnet 500 is a piece of magnetic material magnetized such that is has the north pole side 502 and south pole side 504. In an embodiment, rotatable magnet 500 can instead be a bar magnet contained within a cylindrical housing, with the north pole of the bar magnet disposed in a portion of the cylindrical housing corresponding to the north pole side 502 and the south pole of the bar magnet disposed in a portion of the cylindrical housing corresponding to the south pole side 504. The interface feature 506 can be formed as part of the cylindrical housing. Such a rotatable magnet can be used as discussed above.

Figure 6A:
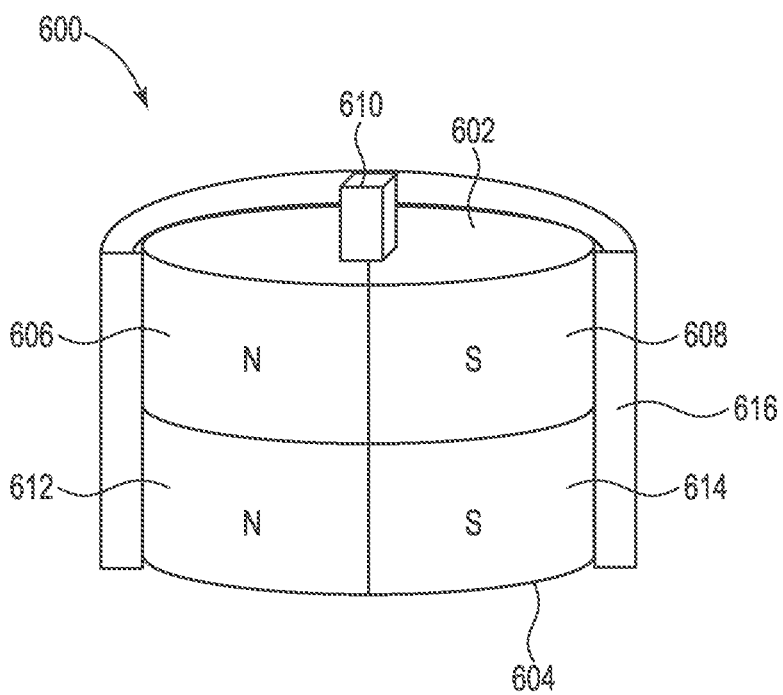
FIG. 6A shows a rotatable magnet assembly according to an embodiment in a high-field configuration.
Figure 6B:
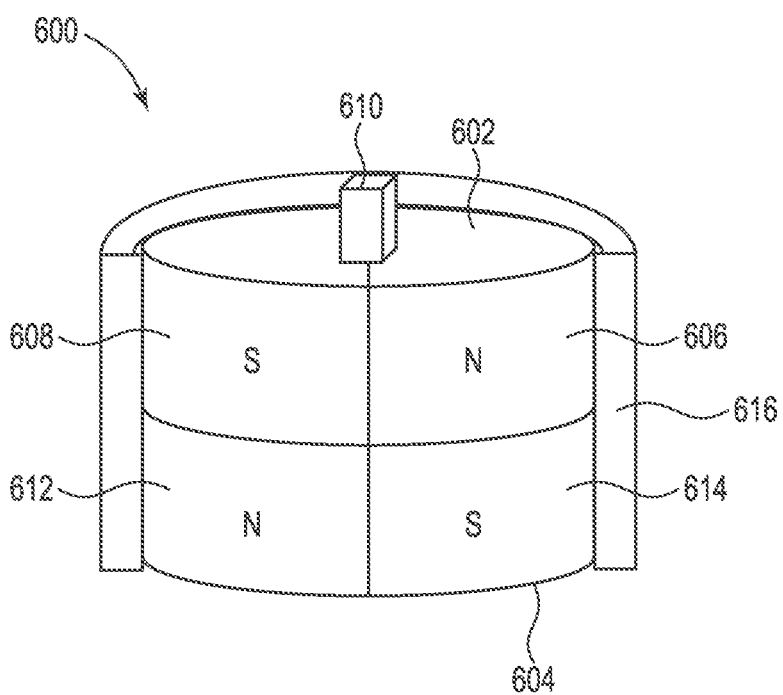
FIG. 6B shows a rotatable magnet assembly according to an embodiment in a low-field configuration.

FIGS. 6A and 6B show a rotatable magnet assembly according to an embodiment. Rotatable magnet assembly 600 includes rotatable magnet segment 602 and fixed magnet segment 604. Rotatable magnet segment 602 includes north pole segment 606, south pole segment 608, and optionally interface feature 610. The fixed magnet 604 includes fixed north pole 612 and fixed south pole 614. In an embodiment, the rotatable magnet assembly 600 can further include an outer sleeve 616 of a ferromagnetic material.

The rotatable magnet assembly 600 can be oriented in a high-field configuration as shown in FIG. 6A, where the north pole segment 606 of the rotatable magnet segment 602 is aligned with the fixed north pole 612 and the south pole segment 608 of the rotatable magnet segment 602 is aligned with the fixed south pole 614.

The rotatable magnet assembly 600 can alternatively be oriented in a low-field configuration as shown in FIG. 6B, where the north pole segment 606 of the rotatable magnet segment 602 is aligned with the fixed south pole 614 and the south pole segment 608 of the rotatable magnet segment 602 is aligned with the fixed north pole 612.

In the high-field configuration of FIG. 6A, the rotatable magnet assembly 600 provides stronger magnetic fields external to the rotatable magnet assembly 600 relative to when in the low-field configuration of FIG. 6B. The high-field configuration of FIG. 6A can be used, for example, when a reticle container including rotatable magnet assembly 600 in a magnetic latch is in the latched state. The rotatable magnet assembly 600 can be switched from the high-field configuration of FIG. 6A to the low-field configuration of FIG. 6B by rotating the rotatable magnet segment 602 relative to the fixed magnet 604, for example by a user, tool, or automation engaging with interface feature 610. When the rotatable magnet assembly 600 is switched to the low-field configuration of FIG. 6B, the magnetic field external to the rotatable magnet assembly 600 is reduced, thus reducing attraction to external ferromagnetic materials such as those included on an opposite portion of a reticle container including the rotatable magnet assembly 600, such that the container can be placed in the unlatched state.

ASPECTS

It is understood that any of aspects 1-11 can be combined with any of aspects 12-19.

Aspect 1. A reticle container, comprising
a first container segment including a ferromagnetic material; and
a second container segment including one or more magnets,
wherein the reticle container is configured to be switched between a latched state where the one or more magnets attracts the ferromagnetic material of the first container segment and an unlatched state the attraction between the ferromagnetic material and the one or more magnets is reduced such that the first container segment can be separated from the second container segment, and
wherein the first container segment and the second container segment define an internal space configured to accommodate a reticle.

Aspect 2. The reticle container according to aspect 1, wherein the ferromagnetic material of the first container segment includes one or more magnets.

Aspect 3. The reticle container according to aspect 2, wherein when in the unlatched state, the one or more magnets of the second container segment repel the ferromagnetic material of the first container segment.

Aspect 4. The reticle container according to any of aspects 1-3, wherein the one or more magnets of the second container segment include at least one rotatable magnet.

Aspect 5. The reticle container according to any of aspects 1-4, wherein the second container segment includes a slidable body, the slidable body including the one or more magnets.

Aspect 6. The reticle container according to aspect 5, wherein the slidable body includes a plurality of magnets.

Aspect 7. The reticle container according to aspect 5 or aspect 6, wherein the slidable body includes a polymer material.

Aspect 8. The reticle container according to any of aspects 1-7, wherein the ferromagnetic material of the first container segment is provided on a slidable body included in the first container segment Aspect 9. The reticle according to aspect 8, wherein the slidable body includes a polymer material.

Aspect 10. The reticle container according to any of aspects 1-9, wherein the ferromagnetic material of the first container segment is configured to be energized to provide an electromagnet.

Aspect 11. The reticle container according to any of aspects 1-10, wherein the one or more magnets are configured to be energized to switch the container to the unlatched state.

Aspect 12. A method of securing and opening a reticle container, comprising:
magnetically latching a first container segment to a second container segment by attraction between a ferromagnetic material included in the first container segment and one or more magnets included in the second container segment; and
unlatching the first container segment from the second container segment by reducing the attraction between the ferromagnetic material and the one or more magnets such that the first container segment can be separated from the second container segment.

Aspect 13. The method according to aspect 12, wherein switching the magnetic latch includes moving one or more magnets and the ferromagnetic material apart from one another.

Aspect 14. The method according to aspect 13, wherein moving the one or more magnets and the ferromagnetic material apart from one another includes sliding a body including one of the one or more magnets or the ferromagnetic material.

Aspect 15. The method according to any of aspects 12-14, wherein the ferromagnetic material included in the first container segment includes one or more magnets.

Aspect 16. The method according to aspect 15, wherein unlatching the first container segment from the second container segment includes positioning the one or more magnets of the ferromagnetic material included in the first container segment so as to oppose the one or more magnets of the second container segment having the same polarity.

Aspect 17. The method according to aspect 16, wherein positioning the one or more magnets of the ferromagnetic material included in the first container segment so as to oppose one or more magnets of the second container segment having the same polarity includes sliding a body containing the one or more magnets of the ferromagnetic material included in the first container segment or the one or more magnets of the second container segment.

Aspect 18. The method according to any of aspects 16-17, wherein positioning the one or more magnets of the ferromagnetic material included in the first container segment so as to oppose the one or more magnets of the second container segment having the same polarity includes rotating at least one of the one or more magnets of the ferromagnetic material included in the first container segment or the one or more magnets of the second container segment.

Aspect 19. The method according to any of aspects 12-18, wherein unlatching the first container segment from the second container segment includes energizing an electromagnet such that the one or more magnets and the ferromagnetic material repel one another.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A reticle container, comprising
a first container segment including a ferromagnetic material; and
a second container segment including one or more magnets,
wherein the reticle container is configured to be switched between a latched state where the one or more magnets attracts the ferromagnetic material of the first container segment and an unlatched state where the attraction between the ferromagnetic material and the one or more magnets is reduced while the first container segment and the second container segment define an internal space configured to accommodate a reticle such that the first container segment can be separated from the second container segment,
wherein the ferromagnetic material of the first container segment includes one or more magnets and wherein when in the unlatched state, the one or more magnets of the second container segment repel the ferromagnetic material of the first container segment.

2. The reticle container of claim 1, wherein the one or more magnets of the second container segment include at least one rotatable magnet.

3. The reticle container of claim 1, wherein the second container segment includes a slidable body, the slidable body including the one or more magnets.

4. The reticle container of claim 3, wherein the slidable body includes a plurality of magnets.

5. The reticle container of claim 3, wherein the slidable body includes a polymer material.

6. The reticle container of claim 1, wherein the ferromagnetic material of the first container segment is provided on a slidable body included in the first container segment.

7. The reticle container of claim 6, wherein the slidable body includes a polymer material.

8. The reticle container of claim 1, wherein the ferromagnetic material of the first container segment is configured to be energized to provide an electromagnet.

9. The reticle container of claim 1, wherein the one or more magnets of the second container are configured to be energized to switch the container to the unlatched state.

10. A method of securing and opening a reticle container, comprising:

magnetically latching a first container segment to a second container segment by attraction between a ferromagnetic material included in the first container segment and one or more magnets included in the second container segment; and unlatching the first container segment from the second container segment by reducing the attraction between the ferromagnetic material and the one or more magnets while the first container segment and the second container segment define an internal space configured to accommodate a reticle such that the first container segment can be separated from the second container segment wherein unlatching the first container segment from the second container segment includes energizing an electromagnet such that the one or more magnets and the ferromagnetic material repel one another.

11. The method of claim 10, wherein unlatching the first container segment from the second container segment includes moving one or more magnets and the ferromagnetic material apart from one another.

12. The method of claim 11, wherein moving the one or more magnets and the ferromagnetic material apart from one another includes sliding a body including one of the one or more magnets or the ferromagnetic material.

13. The method of claim 10, wherein the ferromagnetic material included in the first container segment includes one or more magnets.

14. The method of claim 13, wherein unlatching the first container segment from the second container segment includes positioning the one or more magnets of the ferromagnetic material included in the first container segment so as to oppose the one or more magnets of the second container segment having the same polarity.

15. The method of claim 14, wherein positioning the one or more magnets of the ferromagnetic material included in the first container segment so as to oppose one or more magnets of the second container segment having the same polarity includes sliding a body containing the one or more magnets of the ferromagnetic material included in the first container segment or the one or more magnets of the second container segment.

16. The method of claim 14, wherein positioning the one or more magnets of the ferromagnetic material included in the first container segment so as to oppose the one or more magnets of the second container segment having the same polarity includes rotating at least one of the one or more magnets of the ferromagnetic material included in the first container segment or the one or more magnets of the second container segment.

* * * * *